United States Patent
Kleks et al.

(10) Patent No.: US 8,742,964 B2
(45) Date of Patent: Jun. 3, 2014

(54) NOISE REDUCTION METHOD WITH CHOPPING FOR A MERGED MEMS ACCELEROMETER SENSOR

(71) Applicant: Fairchild Semiconductor Corporation, San Jose, CA (US)

(72) Inventors: Jonathan Adam Kleks, Sunnyvale, CA (US); Ion Opris, San Jose, CA (US); Justin Seng, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/742,942

(22) Filed: Jan. 16, 2013

(65) Prior Publication Data

US 2013/0265183 A1    Oct. 10, 2013

Related U.S. Application Data

(60) Provisional application No. 61/620,019, filed on Apr. 4, 2012.

(51) Int. Cl.
*H03H 3/00*    (2006.01)

(52) U.S. Cl.
USPC ........... 341/143; 341/155; 341/150; 341/153; 327/65; 327/100; 327/124; 327/209; 327/261; 327/554; 375/247; 333/186; 333/197; 333/199

(58) Field of Classification Search
USPC ........... 341/143–155; 327/261, 553, 209.554, 327/65, 100, 124; 375/247; 333/186, 197, 333/199
See application file for complete search history.

(56) References Cited

U.S. PATENT DOCUMENTS

| | | | |
|---|---|---|---|
| 4,896,156 A | * | 1/1990 | Garverick ..................... 341/143 |
| 5,487,305 A | | 1/1996 | Ristic et al. |
| 5,723,790 A | | 3/1998 | Andersson |
| 5,751,154 A | | 5/1998 | Tsugai |
| 5,760,465 A | | 6/1998 | Alcoe et al. |
| 6,214,644 B1 | | 4/2001 | Glenn |
| 6,351,996 B1 | | 3/2002 | Nasiri et al. |
| 6,366,468 B1 | | 4/2002 | Pan |

(Continued)

FOREIGN PATENT DOCUMENTS

| | | |
|---|---|---|
| CN | 102597699 A | 7/2012 |
| CN | 103209922 A | 7/2013 |

(Continued)

OTHER PUBLICATIONS

"U.S. Appl. No. 12/849,742, Non Final Office Action mailed May 28, 2013", 9 pgs.

(Continued)

*Primary Examiner* — Lam T Mai
(74) *Attorney, Agent, or Firm* — Schwegman, Lundberg & Woessner, P.A.

(57) ABSTRACT

An apparatus includes a capacitance-to-voltage converter circuit configured to be electrically coupled to a micro-electro-mechanical system (MEMS) sensor circuit. The capacitance-to-voltage converter circuit includes a differential chopping circuit path configured to receive a differential MEMS sensor output signal and invert a polarity of the differential chopping circuit path, and a differential sigma-delta analog to digital converter (ADC) circuit configured to sample the differential MEMS sensor output signal and provide a digital signal representative of a change in capacitance of the MEMS sensor.

22 Claims, 4 Drawing Sheets

(56) References Cited

U.S. PATENT DOCUMENTS

| | | |
|---|---|---|
| 6,390,905 B1 | 5/2002 | Korovin et al. |
| 6,501,282 B1 | 12/2002 | Dummermuth et al. |
| 6,504,385 B2 | 1/2003 | Hartwell |
| 6,553,835 B1 | 4/2003 | Hobbs et al. |
| 6,725,719 B2 | 4/2004 | Cardarelli |
| 6,781,231 B2 | 8/2004 | Minervini et al. |
| 6,848,304 B2 | 2/2005 | Geen |
| 7,051,590 B1 | 5/2006 | Lemkin et al. |
| 7,093,487 B2 | 8/2006 | Mochida |
| 7,166,910 B2 | 1/2007 | Minervini et al. |
| 7,202,552 B2 | 4/2007 | Zhe et al. |
| 7,210,351 B2 | 5/2007 | Lo et al. |
| 7,221,767 B2 | 5/2007 | Mullenborn et al. |
| 7,240,552 B2 | 7/2007 | Acar et al. |
| 7,258,011 B2 | 8/2007 | Nasiri et al. |
| 7,258,012 B2 | 8/2007 | Xie et al. |
| 7,293,460 B2 | 11/2007 | Zarabadi et al. |
| 7,301,212 B1 | 11/2007 | Mian et al. |
| 7,305,880 B2 | 12/2007 | Caminada et al. |
| 7,358,151 B2 | 4/2008 | Araki et al. |
| 7,436,054 B2 | 10/2008 | Zhe |
| 7,449,355 B2 | 11/2008 | Lutz et al. |
| 7,454,967 B2 * | 11/2008 | Skurnik ................ 73/146.5 |
| 7,518,493 B2 | 4/2009 | Bryzek et al. |
| 7,539,003 B2 | 5/2009 | Ray |
| 7,595,648 B2 * | 9/2009 | Ungaretti et al. ............ 324/678 |
| 7,600,428 B2 | 10/2009 | Robert et al. |
| 7,622,782 B2 | 11/2009 | Chu et al. |
| 7,706,149 B2 | 4/2010 | Yang et al. |
| 7,781,249 B2 | 8/2010 | Laming et al. |
| 7,795,078 B2 | 9/2010 | Ramakrishna et al. |
| 7,950,281 B2 | 5/2011 | Hammerschmidt |
| 8,006,557 B2 | 8/2011 | Yin et al. |
| 8,113,050 B2 | 2/2012 | Acar et al. |
| 8,171,792 B2 | 5/2012 | Sameshima |
| 8,201,449 B2 | 6/2012 | Ohuchi et al. |
| 8,250,921 B2 | 8/2012 | Nasiri et al. |
| 8,421,168 B2 | 4/2013 | Allen et al. |
| 8,476,970 B2 * | 7/2013 | Mokhtar et al. ............. 327/554 |
| 8,508,290 B2 * | 8/2013 | Elsayed et al. ............. 327/553 |
| 2002/0021059 A1 | 2/2002 | Knowles et al. |
| 2002/0178831 A1 | 12/2002 | Takada |
| 2003/0061878 A1 | 4/2003 | Pinson |
| 2003/0200807 A1 | 10/2003 | Hulsing, II |
| 2004/0119137 A1 | 6/2004 | Leonardi et al. |
| 2004/0177689 A1 | 9/2004 | Cho et al. |
| 2004/0219340 A1 | 11/2004 | McNeil et al. |
| 2004/0231420 A1 | 11/2004 | Xie et al. |
| 2004/0251793 A1 | 12/2004 | Matsuhisa |
| 2005/0005698 A1 | 1/2005 | McNeil et al. |
| 2005/0139005 A1 | 6/2005 | Geen |
| 2005/0189635 A1 | 9/2005 | Humpston et al. |
| 2006/0032308 A1 | 2/2006 | Acar et al. |
| 2006/0034472 A1 | 2/2006 | Bazarjani et al. |
| 2006/0043608 A1 | 3/2006 | Bernier et al. |
| 2006/0137457 A1 | 6/2006 | Zdeblick |
| 2006/0213265 A1 | 9/2006 | Weber et al. |
| 2006/0213266 A1 | 9/2006 | French et al. |
| 2006/0213268 A1 | 9/2006 | Asami et al. |
| 2006/0246631 A1 | 11/2006 | Lutz et al. |
| 2007/0013052 A1 | 1/2007 | Zhe et al. |
| 2007/0040231 A1 | 2/2007 | Harney et al. |
| 2007/0047744 A1 | 3/2007 | Harney et al. |
| 2007/0071268 A1 | 3/2007 | Harney et al. |
| 2007/0099327 A1 | 5/2007 | Hartzell et al. |
| 2007/0114643 A1 | 5/2007 | DCamp et al. |
| 2007/0165888 A1 | 7/2007 | Weigold |
| 2007/0205492 A1 | 9/2007 | Wang |
| 2007/0220973 A1 | 9/2007 | Acar |
| 2007/0222021 A1 | 9/2007 | Yao |
| 2007/0284682 A1 | 12/2007 | Laming et al. |
| 2008/0049230 A1 | 2/2008 | Chin et al. |
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0157238 A1 | 7/2008 | Hsiao |
| 2008/0157301 A1 | 7/2008 | Ramakrishna et al. |
| 2008/0247585 A1 | 10/2008 | Leidl et al. |
| 2008/0251866 A1 | 10/2008 | Belt et al. |
| 2008/0290756 A1 | 11/2008 | Huang |
| 2008/0302559 A1 | 12/2008 | Leedy |
| 2008/0314147 A1 | 12/2008 | Nasiri et al. |
| 2009/0064780 A1 | 3/2009 | Coronato et al. |
| 2009/0140606 A1 | 6/2009 | Huang |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0263937 A1 | 10/2009 | Ramakrishna et al. |
| 2009/0266163 A1 | 10/2009 | Ohuchi et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee et al. |
| 2010/0072626 A1 | 3/2010 | Theuss et al. |
| 2010/0155863 A1 | 6/2010 | Weekamp |
| 2010/0206074 A1 | 8/2010 | Yoshida et al. |
| 2010/0224004 A1 | 9/2010 | Suminto et al. |
| 2010/0236327 A1 | 9/2010 | Mao et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0094302 A1 | 4/2011 | Schofield et al. |
| 2011/0121413 A1 | 5/2011 | Allen et al. |
| 2011/0265564 A1 | 11/2011 | Acar et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |

FOREIGN PATENT DOCUMENTS

| | | |
|---|---|---|
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| EP | 1460380 A1 | 9/2004 |
| EP | 1521086 A1 | 4/2005 |
| EP | 1688705 A2 | 8/2006 |
| EP | 1860402 A1 | 11/2007 |
| EP | 2259019 A1 | 12/2010 |
| JP | 09089927 A | 4/1997 |
| JP | 10239347 A | 9/1998 |
| JP | 2005024310 A | 1/2005 |
| JP | 2005114394 A | 4/2005 |
| JP | 2005294462 A | 10/2005 |
| JP | 2007024864 A | 2/2007 |
| JP | 2009075097 A | 4/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 1020130097209 A | 9/2013 |
| WO | WO-2008059757 A1 | 5/2008 |
| WO | WO-2008087578 A2 | 7/2008 |
| WO | WO-2011016859 A2 | 2/2011 |
| WO | WO-2011016859 A3 | 2/2011 |
| WO | WO-2012037492 A2 | 3/2012 |
| WO | WO-2012037492 A3 | 3/2012 |

(56) References Cited

FOREIGN PATENT DOCUMENTS

| | | |
|---|---|---|
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 12/849,742, Non Final Office Action mailed Aug. 23, 2012", 9 pgs.
"U.S. Appl. No. 12/849,787, Response filed Feb. 4, 2013 to Restriction Requirement mailed Oct. 4, 2012", 7 pgs.
"U.S. Appl. No. 12/849,787, Restriction Requirement mailed Oct. 4, 2012", 5 pgs.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Mar. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 20, 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.

"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 12/849,742, Response filed Sep. 30, 2013 to Non-Final Office Action mailed Mar. 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.

(56) References Cited

OTHER PUBLICATIONS

"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jul. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf?...>, (Jan. 1, 2004), 123 pgs.
"U.S. Appl. No. 12/849,742, Response filed Jan. 23, 2012 to Non Final Office Action mailed Aug. 23, 2012", 10 pgs.
"U.S. Appl. No. 12/849,787, Non Final Office Action mailed May 28, 2013", 18 pgs.
"U.S. Appl. No. 12/947,543, Notice of Allowance mailed Dec. 17, 2012", 11 pgs.
"U.S. Appl. No. 13/813,443, Preliminary Amendment mailed Jan. 31, 2013", 3 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,598, Preliminary Amendment mailed Mar. 8, 2013", 7 pgs.
"U.S. Appl. No. 13/821,609, Preliminary Amendment mailed Mar. 8, 2013", 3 pgs.
"U.S. Appl. No. 13/821,612, Preliminary Amendment mailed Mar. 8, 2013", 3 pgs.
"U.S. Appl. No. 13/821,619, Preliminary Amendment mailed Mar. 8, 2013", 3 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Application Serial No. PCT/US2011/051994, International Republished Application mailed Jun. 7, 2012", 1 pg.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2011/051994, International Preliminary Report on Patentability mailed Mar. 28, 2013", 8 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.
"International Application Serial No. PCT/US2013/021411, International Search Report mailed Mar. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Krishnamurthy, Rajesh, et al., "Drilling and Filling, but not in your Dentist's Chair a look at some recent history of multi-chip and through silicon via (TSV) technology", Chip Design Magazine, (Oct./Nov. 2008), 7 pgs.

(56) References Cited

OTHER PUBLICATIONS

U.S. Appl. No. 13/362,955, filed Jan. 31, 2012, MEMS Multi-Axis Accelerometer Electrode Structure.
U.S. Appl. No. 13/363,537, filed Feb. 1, 2012, MEMS Proof Mass With Split Z-Axis Portions.
U.S. Appl. No. 13/755,841, filed Jan. 31, 2013, MEMS Multi-Axis Gyroscope With Central Suspension Gimbal Structure.
U.S. Appl. No. 13/755,953, filed Jan. 31, 2013, MEMS Multi-Axis Gyroscope Z-Axis Electrode Structure.
U.S. Appl. No. 13/742,994, filed Jan. 16, 2013, Self Test of MEMS Accelerometer with ASICS Integrated Capacitors.
U.S. Appl. No. 13/746,016, filed Jan. 21, 2013, Accurate Ninety-Degree Phase Shifter.
U.S. Appl. No. 13/857,363, filed Apr. 5, 2013, MEMS Device Automatic-Gain Control Loop for Mechanical Amplitude Drive.
U.S. Appl. No. 13/857,377, filed Apr. 5, 2013, MEMS Device Quadrature Shift Cancellation.
U.S. Appl. No. 13/857,349, filed Apr. 5, 2013, MEMS Device Front-End Charge Amplifier.
U.S. Appl. No. 13/765,068, filed Feb. 12, 2013, Self Test of MEMS Gyroscope With ASICS Integrated Capacitors.
U.S. Appl. No. 13/860,761, filed Apr. 11, 2013, Micro-Electro-Mechanical-System (MEMS) Driver.
U.S. Appl. No. 13/860,780, filed Apr. 11, 2013, MEMS Quadrature Cancellation and Signal Demodulation.
U.S. Appl. No. 13/362,955, Response filed Feb. 17, 2014 to Restriction Requirement mailed Dec. 17, 2013, 9 pgs.
U.S. Appl. No. 13/363,537, Non Final Office Action mailed Feb. 6, 2014, 10 pgs.
U.S. Appl. No. 13/755,841, Restriction Requirement mailed Feb. 21, 2014, 6 pgs.

\* cited by examiner

NOISE REDUCTION METHOD WITH CHOPPING FOR A MERGED MEMS ACCELEROMETER SENSOR

CLAIM OF PRIORITY

This application claims the benefit of priority under 35 U.S.C. §119(e) of Kleks et al., U.S. Provisional Patent Application Ser. No. 61/620,019, filed on Apr. 4, 2012, which is hereby incorporated by reference herein in its entirety.

BACKGROUND

Micro-electromechanical systems (MEMS) include small mechanical devices performing electrical and mechanical functions that are fabricated using photo-lithography techniques similar to techniques used to fabricate integrated circuits. Some MEMS devices are sensors that can detect motion such as an accelerometer or detect angular rate such as a gyroscope. An accelerometer is a device that undergoes a measurable change in response to acceleration acting on the device. MEMS accelerometers can include piezoelectric, piezoresistive, and capacitive accelerometers. Because of their small size, MEMS sensors are being incorporated into electronic devices such as video game controllers and smart phones.

Capacitive accelerometers undergo a change in capacitance in response to acceleration. Sensing circuits are used to sense the change in capacitance of the MEMS sensor. The design of these sensing circuits poses challenges to reduce noise and minimize size.

Overview

This document discusses, among other things, systems and methods for reducing noise in MEMS sensors. An apparatus example includes a capacitance-to-voltage converter circuit configured to be electrically coupled to a micro-electromechanical system (MEMS) sensor circuit. The capacitance-to-voltage converter circuit includes a differential chopping circuit path configured to receive a differential MEMS sensor output signal and invert a polarity of the differential chopping circuit path, and a differential sigma-delta analog to digital converter (ADC) circuit configured to sample the differential MEMS sensor output signal and provide a digital signal representative of a change in capacitance of the MEMS sensor.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
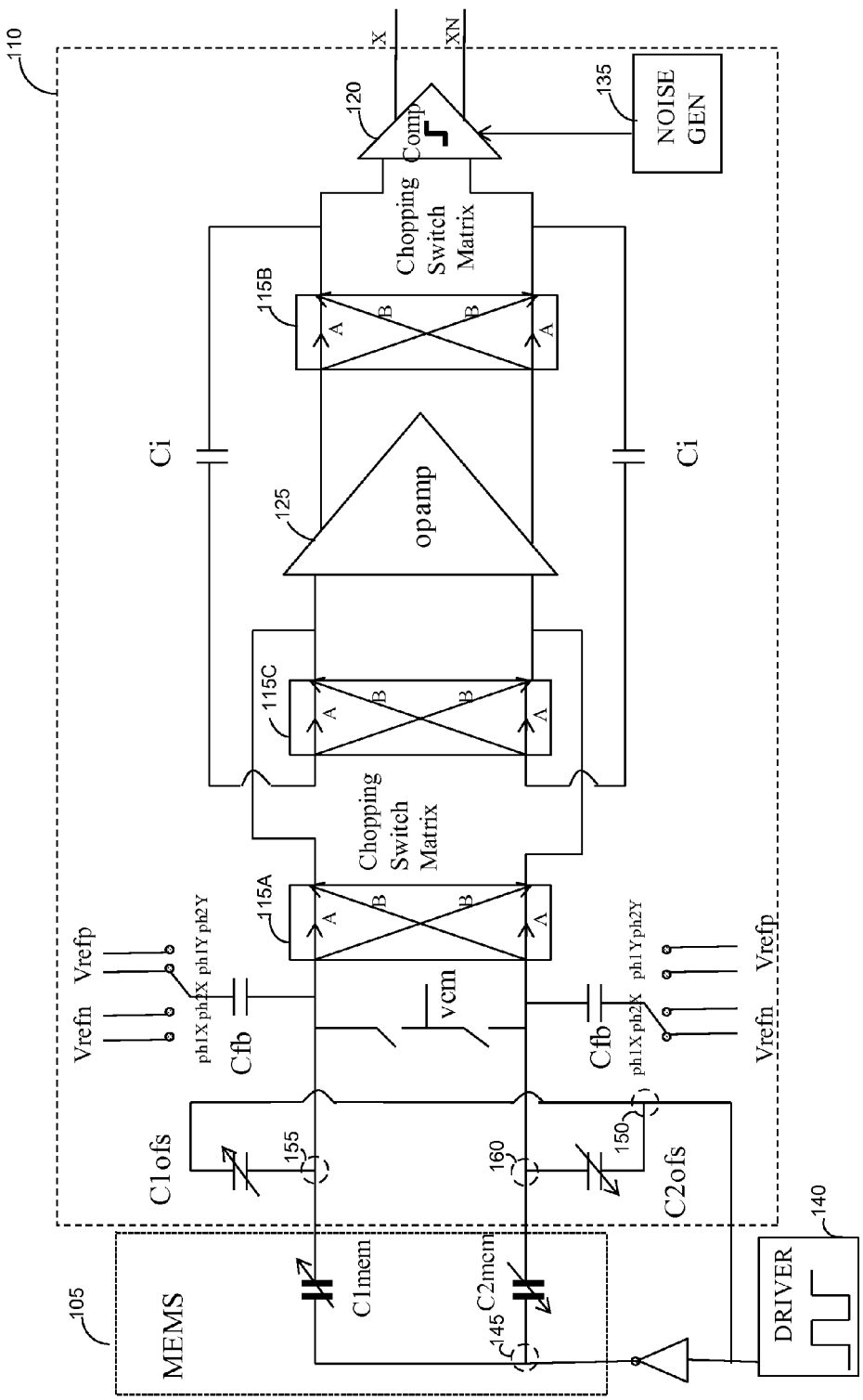
FIG. 1 is an illustration of a block diagram of portions of an example of a MEMS sensor and a sensing circuit to monitor changes in the MEMS sensor output.

FIG. 1 is an illustration of a block diagram of portions of an example of a MEMS sensor circuit 105 and a sensing circuit 110 electrically coupled to the MEMS sensor circuit 105 to monitor changes in the MEMS sensor output. The MEMS sensor circuit 105 may be a capacitive accelerometer in which the sensing circuit 110 monitors changes in capacitance of the sensor in response to acceleration acting on the sensor.

A typical MEMS capacitive accelerometer includes a movable proof mass with capacitive elements attached through mechanical suspension to a reference frame. Two capacitive elements of a MEMS sensor are shown in FIG. 1 as circuit capacitors labeled C1mem and C2mem. An actual capacitive element can be composed of multiple plates electrically coupled (e.g., in parallel) to produce an overall capacitance represented in the Figure as capacitor C1mem or C2mem. The capacitors form a bridge from two outputs of the MEMS sensor circuit 105 to a common circuit node 115 that can represent a circuit connection to the movable proof mass. One plate or set of plates of each of the capacitors can be attached to the movable proof mass while the other plate or set of plates is stationary.

The acceleration signal is sensed by detecting a charge imbalance across the differential capacitive bridge formed by capacitors C1mem, C1ofs, C2mem and C2ofs. Capacitors C1mem and C1ofs form one leg of a differential capacitive bridge while capacitor C2mem and C2ofs form the second leg of the differential capacitive bridge. The two inputs to this differential bridge are: 1) circuit node 145 which is the MEMs proof mass connection which is driven from the driver circuit 140; and 2) circuit node 150 which is driven inverted in phase to node 145. The outputs of this differential bridge are circuit nodes 155 and 160. Thus, nodes 155 and 160 form the sensor input to the sensing circuit 110. Any differential imbalances in the capacitors in this circuit will show up at nodes 155 and 160 as a differential charge that will be measured by the sensing circuit 110.

Acceleration applied to the MEMS accelerometer causes movement of the proof mass. The displacement of the proof mass changes the spacing between plates of the capacitors. The displacement is approximately proportional to the resulting difference in capacitance between the two capacitive elements. Modeling the proof mass and mechanical suspension as a spring allows the acceleration to be determined from the displacement according to Hooke's Law.

In general, the change in capacitance to the capacitor pair is related to linear acceleration in one direction. An additional capacitor pair arranged perpendicular to the first pair allows acceleration in a second direction to be determined. This can provide a two-axis accelerometer. Three capacitor pairs allows for a three-axis or three-dimensional (3D) accelerometer.

The sensing circuit 110 senses the change in capacitance of the MEMS sensor and converts the capacitive change to a voltage. Thus, the sensing circuit 110 functions as a capacitance-to-voltage converter circuit or a C2V sensor. The capacitance-to-voltage converter circuit receives a differential MEMS sensor output signal from the MEMS sensor circuit 105. The capacitance-to-voltage converter circuit includes a differential sigma-delta analog to digital converter (ADC) circuit that samples the differential MEMS sensor output signal and provides a digital signal representative of a change in capacitance of the MEMS sensor circuit 105. It can be seen in the Figure that the capacitors of the MEMS sensor circuit 105 are used with offset capacitors C1ofs and C2ofs as sensing capacitors for the sigma-delta ADC; effectively merging the capacitance-to-voltage sensing with the sigma-delta ADC circuit.

In the example shown in FIG. 1, the sigma-delta ADC circuit includes an integrator circuit and a comparator circuit 120. The integrator circuit in the example is a first order integrator circuit and includes an operational amplifier (opamp) circuit 125. In certain examples, the integrator circuit includes a higher order (e.g., second order) integrator circuit. The comparator circuit provides the digital output signal and can be followed by a low pass filter to reduce switching noise from the sampling of the MEMS sensor output.

The capacitance-to-voltage converter circuit also includes a differential chopping circuit path that receives the differential MEMS sensor output signal and inverts a polarity of the differential chopping circuit path. Other methods of sensing the MEMS sensor output includes correlated-double sampling of the of the MEMS sensor output signal. The chopping method improves the noise reduction of 1/f noise in the MEMS accelerometer analog front end sensing circuit. Chopping also uses less capacitors than a correlated-double sampling method. Reducing the number of capacitors lowers thermal noise (KT/C) and reduces the area used by the capacitance-to-voltage converter circuit on an integrated circuit (e.g., an application specific integrated circuit or ASIC). Reducing the number of capacitors can also reduce settling time of amplifiers, such as the opamp used in the integrator circuit. Reduced settling time can reduce power consumption. As a result of the noise reduction methods described herein the first order sigma-delta ADC circuit can provide greater than 100 decibels of dynamic range.

Figure 2:
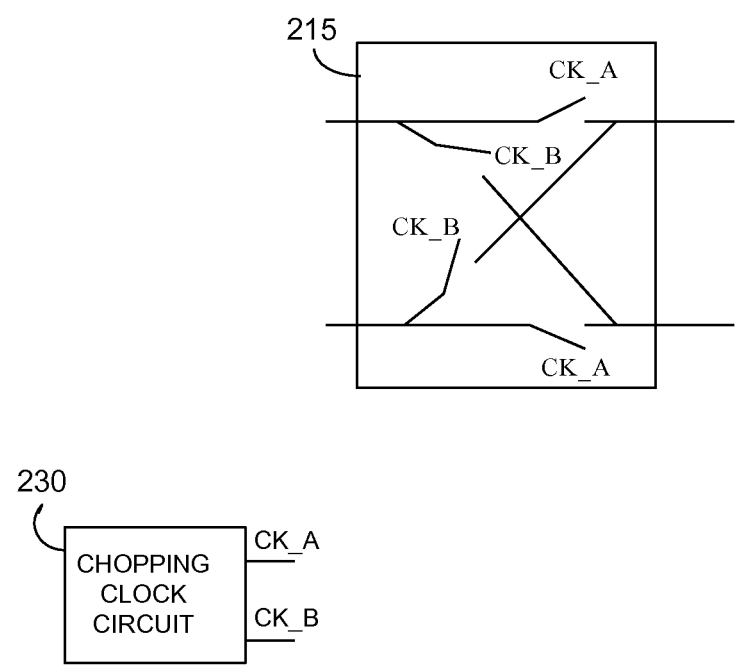
FIG. 2 shows an example of a chopping switch matrix circuit.

The differential chopping circuit path is implemented using chopping switch matrix circuits (115A, 115B, 115C). FIG. 2 shows an example of a chopping switch matrix circuit 215. The circuit operates according to chopping clock signals CK_A and CK_B provided by chopping clock circuit 230. When the chopping switch matrix circuit is clocked with chopping clock phase CK_A, the differential signal at the input to the circuit is passed. When the chopping switch matrix circuit is clocked with chopping clock phase CK_B, the differential signal at the input to the circuit is inverted. When CK_A is active or "on," CK_B is off, and vice versa.

In the example of FIG. 1, the differential chopping circuit path includes a first chopping switch matrix circuit 115A that inverts the polarity of the differential chopping circuit path at an input of the opamp circuit 125, and includes a second chopping switch matrix circuit 115B that inverts the polarity of the differential chopping circuit path at an output of the opamp circuit 125. In some examples, the differential chopping circuit path includes a third chopping switch matrix circuit 115C that switches polarity of a differential feedback circuit path of the differential sigma-delta ADC circuit. In the example shown, the differential feedback circuit path extends from an output of the second chopping switch matrix circuit 115B to an input of the third chopping switch matrix circuit 115C.

Figure 3:
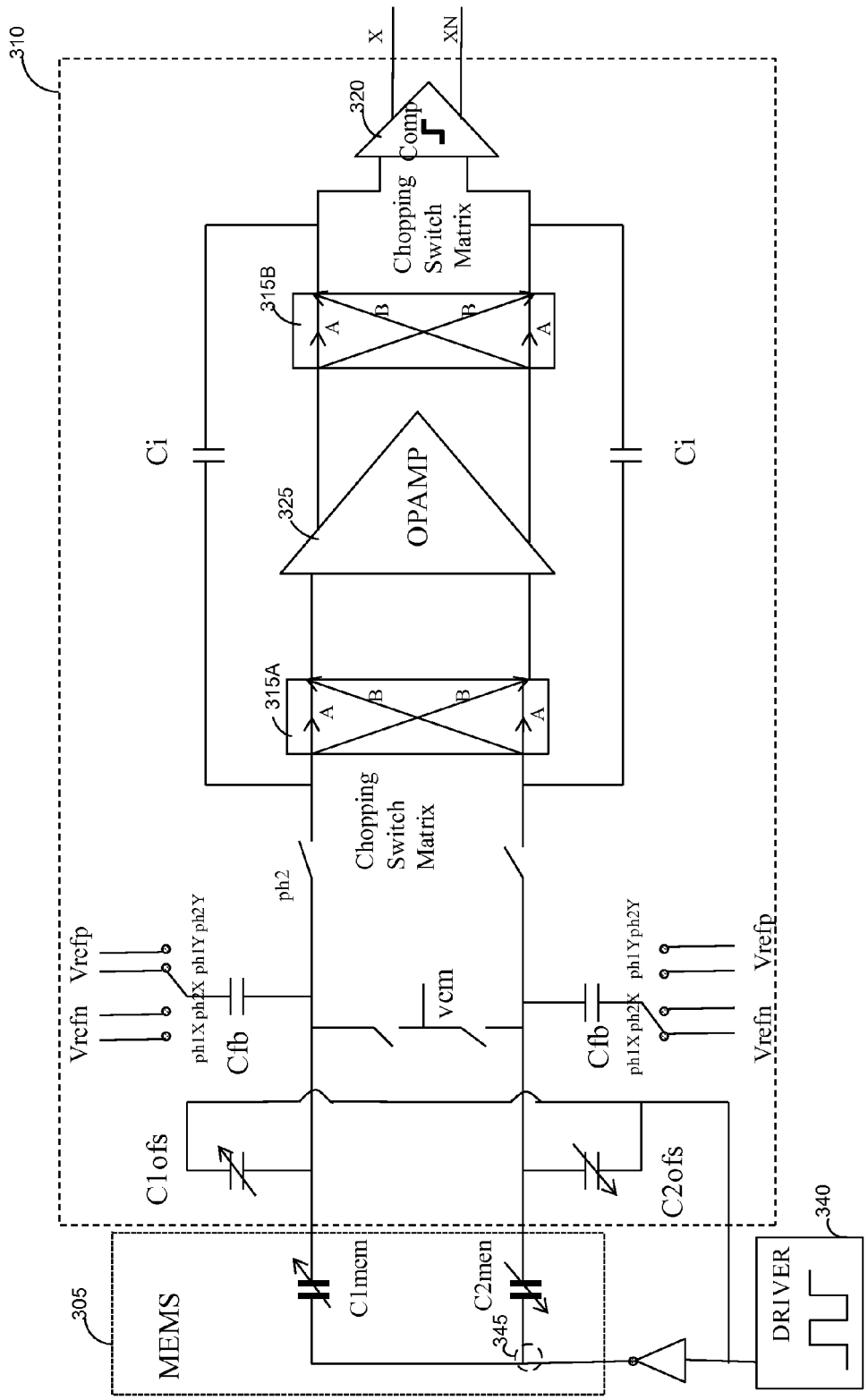
FIG. 3 shows another example of a capacitance-to-voltage converter circuit with a differential chopping circuit path.

FIG. 3 shows another example of a capacitance-to-voltage converter circuit with a differential chopping circuit path. The example includes only two chopping switch matrix circuits 315A and 315B in the differential chopping circuit path. The differential chopping circuit path also includes a differential feedback circuit path extending from an output of the second chopping switch matrix circuit 315B to an input of the first chopping switch matrix circuit 315A.

Returning to FIG. 1, a driver circuit 140 can be electrically coupled to the MEMS sensor circuit 105 to apply a square wave excitation signal to a drive input of the MEMS sensor. The drive input can be electrically coupled to a circuit node 145 that represents the proof mass of the MEMS sensor circuit 105. The sensing circuit 110 can include a phase clock circuit (not shown) that generates a first operational clock phase (Ph1) and a second operational clock phase (Ph2). The operational clock phases Ph1 and Ph2 are non-overlapping and have opposite polarity. During Ph1, the first chopping switch matrix circuit 115A electrically isolates the MEMS sensor circuit 105 from the differential sigma-delta ADC circuit. The second chopping switch matrix circuit 115B and the third chopping switch matrix circuit 115C hold the previous value of the sensor output signal.

During Ph2, the first, second, and third chopping switch matrix circuits 115A, 115B, 115C invert the polarity of the differential chopping circuit path. The capacitance of the MEMS sensor circuit 105 can be sampled in relation to the excitation signal. The first and second operational clock phases Ph1 and Ph2 can have the same frequency and duty cycle as the square wave excitation signal. The second and third chopping switch matrix circuits 115B and 115C can be switched together by the chopping clocks. The first chopping switch matrix circuit 115A can be switched by a signal that is a logical AND of the chopping clocks and the Ph2 clock.

Sigma-delta ADC circuits can be susceptible to dead-bands or dead-zones. As a signal is sampled, the output can contain repeating patterns of ones and zeros sometimes referred to an idle tone. For an input signal with a small amplitude, the output of the sigma-delta circuit can continue in the repeating pattern. The small-amplitude input signal may not be coded by the sigma-delta ADC resulting in the dead-band range of input signals. However, it may be desirable to encode signals of small amplitude to take advantage of the full dynamic range of the differential sigma-delta ADC circuits shown in FIGS. 1 and 3.

The capacitance-to-voltage converter circuit can include a chopping clock circuit that clocks the differential chopping circuit path with a periodic or regular chopping clock signal. To prevent or minimize a dead-band in the differential sigma-delta ADC circuit, the capacitance-to-voltage converter circuit can include a chopping clock circuit that clocks the differential chopping circuit path with a pseudo-random clock signal. The pseudo-random clock signal includes random transitions from high to low while making sure that CK_A is only on when CK_B is off and vice versa. This pseudo-random clocking minimizes limit cycles of the integrator circuit which can lead to the dead-bands.

Another method to prevent or minimize the dead-band in the differential sigma-delta ADC circuit is to apply dither noise to the comparator circuit 120. The capacitance-to-voltage converter circuit can include a pseudo-random noise generator circuit 135 electrically coupled to the comparator circuit to apply dither noise to an input of the comparator circuit. If the output of the comparator is evaluated at the end of the second operational clock phase Ph2, a pseudo-random dither noise signal can be injected into the comparator during Ph2 to remove the dead-band idle tones. The dither noise forces the output of the sigma-delta ADC circuit out of the dead-band.

As explained previously herein, a MEMS sensor circuit can be a two-axis accelerometer. In this case, the MEMS sensor circuit can change the value of a first capacitance in response to linear acceleration in a first direction and change the value of a second capacitance in response to linear acceleration in a second direction, such as a direction orthogonal to the first direction for example. The sensing circuit can include a first capacitance-to-voltage converter circuit to generate a first digital signal representative of the change in the first capacitance, and a second capacitance-to-voltage converter circuit to generate a second digital signal representative of the change in the second capacitance. The output of a three-axis accelerometer can be sensed using a third capacitance-to-voltage converter circuit.

Figure 4:
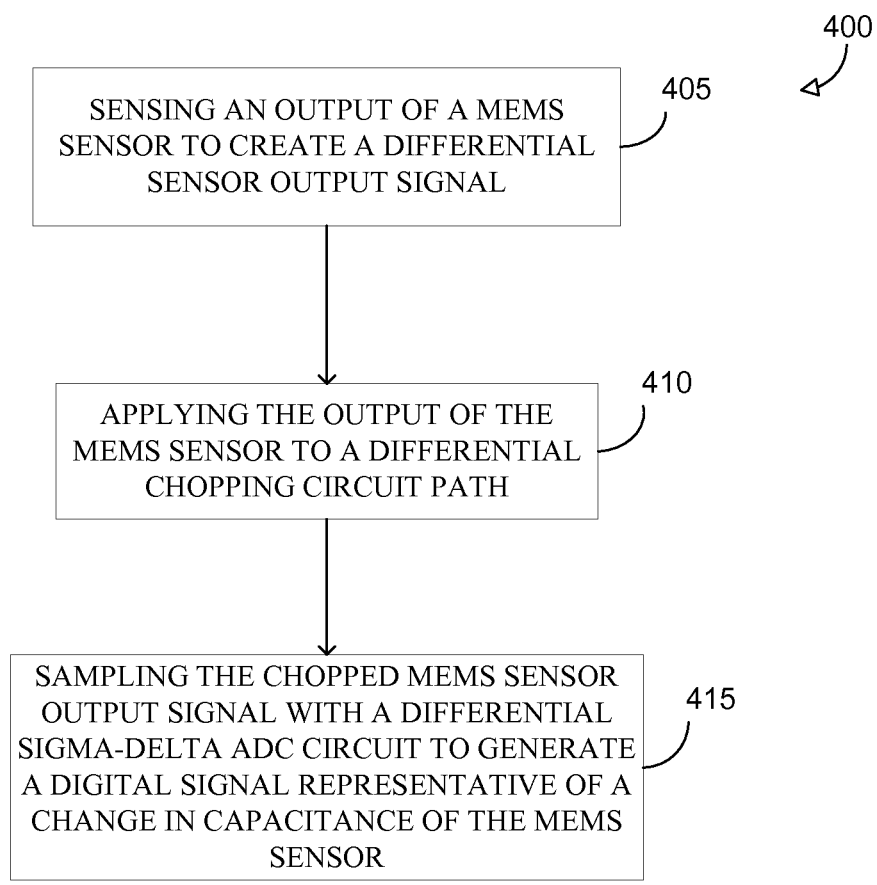
FIG. 4 is a flow diagram of a method of reducing noise in a MEMS accelerometer sensing circuit.

FIG. 4 is a flow diagram of a method 400 of reducing noise in MEMS accelerometer sensing circuits. At block 405, the output of an MEMS sensor is sensed to create a differential sensor output signal. At block 410, the output of the MEMS sensor is applied to a differential chopping circuit path to reduce noise in the circuit. To implement the chopping, the polarity of the differential chopping circuit path is inverted at timed intervals. In certain examples, the polarity of the circuit path is inverted at regular intervals and in certain examples the polarity is inverted or chopped at pseudo-random intervals. At block 415, the chopped MEMS sensor output signal is sampled with a differential sigma-delta ADC circuit to generate a digital signal representative of a change in capacitance of the MEMS sensor.

Chopping the output sampled from the MEMS sensor reduces 1/f noise and thermal noise resulting in a first order signal-delta ADC circuit with more than 100 dB of dynamic range. To take full advantage of the dynamic range, the signal chopping can be performed at pseudo-random intervals to minimize the occurrence of dead-bands in the output of the sigma-delta ADC circuit, and dither noise can be applied to the differential sigma-delta ADC circuit to remove idle tones.

ADDITIONAL NOTES AND EXAMPLES

Example 1 can include or use subject matter (such as an apparatus) comprising a capacitance-to-voltage converter circuit configured to be electrically coupled to a MEMS sensor circuit. The capacitance-to-voltage converter circuit can include a differential chopping circuit path configured to receive a differential MEMS sensor output signal and invert a polarity of the differential chopping circuit path, and a differential sigma-delta analog to digital converter (ADC) circuit configured to sample the differential MEMS sensor output signal and provide a digital signal representative of a change in capacitance of the MEMS sensor.

In Example 2, the subject matter of Example 1 can optionally include a differential sigma-delta ADC circuit that includes a comparator circuit, and a pseudo-random noise generator circuit electrically coupled to the comparator circuit and configured to apply dither noise to an input of the comparator circuit.

In Example 3, the subject matter of one or any combination of Examples 1 and 2 can optionally include a chopping clock circuit configured to clock the differential chopping circuit path with a pseudo-random clock signal.

In Example 4, the subject matter of one or any combination of Examples 1-3 can optionally include a differential sigma-delta ADC circuit that includes an opamp circuit, a first chopping switch matrix circuit configured to invert the polarity of the differential chopping circuit path at an input of the opamp circuit, and a second chopping switch matrix circuit configured to invert the polarity of the differential chopping circuit path at an output of the opamp circuit.

In Example 5, the subject matter of Example 4 can optionally include a third chopping switch matrix circuit configured to switch a polarity of a differential feedback circuit path of the differential sigma-delta ADC circuit. The differential feedback circuit path can optionally extend from an output of the second chopping switch matrix circuit to an input of the third chopping switch matrix circuit.

In Example 6, the subject matter of Example 4 can optionally include the differential feedback circuit path extending from an output of the second chopping switch matrix circuit to an input of the first chopping switch matrix circuit.

In Example 7, the subject matter of one or any combination of Examples 1-6 can optionally include a phase clock circuit configured to generate a first operational clock phase and a second operational clock phase. During the first operational clock phase, the first chopping switch matrix circuit can optionally be configured to electrically isolate the MEMS sensor circuit from the differential sigma-delta ADC circuit. During the second operational clock phase, the first and second chopping switch matrix circuits can optionally be configured to invert the polarity of the differential chopping circuit path.

In Example 8, the subject matter of one or any combination of Examples 1-7 can optionally include a driver circuit electrically coupled to the MEMS sensor. The driver circuit can optionally be configured to apply a square wave excitation signal to a drive input of the MEMS sensor, and the first and second operational clock phases have the same frequency and duty cycle as the square wave excitation signal.

In Example 9, the subject matter of one or any combination of Examples 1-8 can optionally include the MEMS sensor circuit. The MEMS sensor circuit can optionally be configured to change capacitance in response to linear acceleration in a first direction.

Example 10 can include subject matter (such as an apparatus) that includes, or can optionally be combined with the subject matter of one or any combination of Examples 1-9 to include a capacitance-to-voltage converter circuit configured to be electrically coupled to a MEMS sensor circuit. The capacitance-to-voltage converter circuit can include a differential circuit path configured to receive a differential MEMS sensor output signal, and a differential sigma-delta ADC circuit configured to sample the differential MEMS sensor output signal and provide a digital signal representative of a change in capacitance of the MEMS sensor. The differential sigma-delta ADC circuit can includes a comparator circuit and the capacitance-to-voltage converter circuit can include a pseudo-random noise generator circuit electrically coupled to the comparator circuit and configured to apply dither noise to an input of the comparator circuit.

In Example 11, the subject matter of Example 10 can optionally include the MEMS sensor circuit. The MEMS sensor circuit can optionally be configured to change capacitance in response to linear acceleration in a first direction.

In Example 12, the subject matter of Example 11 can optionally include a switch circuit electrically coupled to the MEMS sensor, a driver circuit electrically coupled to the MEMS sensor and configured to apply a square wave excitation signal to a drive input of the MEMS sensor, and a phase clock circuit electrically coupled to the switch circuit and configured to generate a first operational clock phase and a second operational clock phase. The first and second operational clock phases can optionally have the same frequency and duty cycle as the square wave excitation signal. During the first operational clock phase, the switch circuit can optionally be configured to electrically isolate the MEMS sensor circuit from the differential sigma-delta ADC circuit and the MEMS sensor circuit is configured to sample the linear acceleration.

In Example 13, the subject matter of one or any combination of Examples 11 and 12 can optionally include a MEMS sensor circuit configured to change a first capacitance in response to linear acceleration in a first direction and change a second capacitance in response to linear acceleration in a second direction, a first capacitance-to-voltage converter circuit to generate a first digital signal representative of a change in the first capacitance, and a second capacitance-to-voltage converter circuit to generate a second digital signal representative of a change in the second capacitance.

Example 14 can include subject matter (such as a method, a means for performing acts, or a machine readable medium including instructions that, when performed by the machine, that can cause the machine to perform acts), or can optionally be combined with the subject matter of one or any combination of Examples 1-13 to include subject matter, comprising sensing an output of a MEMS sensor to create a differential sensor output signal, applying the output of the MEMS sensor to a differential chopping circuit path, wherein a polarity of the differential chopping circuit path is inverted at timed intervals, and sampling the chopped MEMS sensor output signal to generate a digital signal representative of a change in capacitance of the MEMS sensor. Such subject matter can include means for sensing an output of a MEMS sensor to create a differential sensor output signal, illustrative examples of which can include a charge-to-voltage converter circuit. Such subject matter can include means for applying the output of the MEMS sensor to a differential chopping circuit path, illustrative examples of which can include the charge-to-voltage converter circuit. Such subject matter can include means for sampling the chopped MEMS sensor output signal to generate a digital signal representative of a change in capacitance of the MEMS sensor, illustrative examples of which can include a differential ADC circuit, and sigma-delta ADC circuit.

In example 15, the subject matter of Example 14 can optionally include sampling the chopped MEMS sensor output signal using a differential sigma-delta ADC circuit and applying dither noise to the differential sigma-delta ADC circuit.

In Example 16, the subject matter of one or any combination of Examples 14 and 15 can optionally include clocking the differential chopping circuit path with a pseudo-random clock signal.

In Example 17, the subject matter of one or any combination of Examples 14-16 can optionally include sampling the chopped MEMS sensor output signal using a differential sigma-delta ADC circuit, inverting the polarity of the differential chopping circuit path at an input of an opamp circuit of the differential sigma-delta ADC circuit, and inverting the polarity of the differential chopping circuit path at an output of the opamp circuit.

In Example 18, the subject matter of one or any combination of Examples 14-17 can optionally include feeding back a differential output of the opamp circuit to a differential input of the opamp circuit to form a differential feedback circuit path, and inverting a polarity of the differential feedback circuit path at timed intervals.

In Example 19, the subject matter of one or any combination of Examples 14-18 can optionally include electrically isolating the MEMS sensor circuit from the differential sigma-delta ADC circuit during a first operational clock phase, and inverting the polarity of the differential chopping circuit path during a second operational clock phase.

In Example 20, the subject matter of one or any combination of Examples 14-18 can optionally include applying a square wave excitation signal to a drive input of the MEMS sensor such that the first and second operational clock phases have the same frequency and duty cycle as the square wave excitation signal, and sampling the linear acceleration using the MEMS sensor during the first operational clock phase In Example 21, the subject matter of one or any combination of Examples 14-20 can optionally include sensing a change in capacitance of the MEMS sensor in response to linear acceleration in a first direction.

In Example 22, the subject matter of one or any combination of Examples 14-21 can optionally include sensing a first output of the MEMS sensor to sense a change in capacitance of the MEMS sensor in response to linear acceleration in a first direction, and sensing a second output of the MEMS sensor to sense a change in capacitance of the MEMS sensor in response to linear acceleration in a second direction, wherein the second direction is orthogonal to the first direction.

Example 23 can include, or can optionally be combined with any portion or combination of any portions of any one or more of Examples 1-22 to include, subject matter that can include means for performing any one or more of the functions of Examples 1-22, or a machine-readable medium including instructions that, when performed by a machine, cause the machine to perform any one or more of the functions of Examples 1-22.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. The above-described embodiments (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
a capacitance-to-voltage converter circuit configured to be electrically coupled to a micro-electromechanical system (MEMS) sensor circuit, the capacitance-to-voltage converter circuit including:
a differential chopping circuit path configured to receive a differential MEMS sensor output signal and invert a polarity of the differential chopping circuit path; and
a differential sigma-delta analog to digital converter (ADC) circuit configured to sample the differential MEMS sensor output signal and provide a digital signal representative of a change in capacitance of the MEMS sensor.

2. The apparatus of claim 1,
wherein the differential sigma-delta ADC circuit includes a comparator circuit, and
wherein the apparatus includes a pseudo-random noise generator circuit electrically coupled to the comparator circuit and configured to apply dither noise to an input of the comparator circuit.

3. The apparatus of claim 1, including a chopping clock circuit configured to clock the differential chopping circuit path with a pseudo-random clock signal.

4. The apparatus of claim 1,
wherein the differential sigma-delta ADC circuit includes an operational amplifier (opamp) circuit, and wherein the apparatus includes:
a first chopping switch matrix circuit configured to invert the polarity of the differential chopping circuit path at an input of the opamp circuit; and
a second chopping switch matrix circuit configured to invert the polarity of the differential chopping circuit path at an output of the opamp circuit.

5. The apparatus of claim 4, including:
a third chopping switch matrix circuit configured to switch a polarity of a differential feedback circuit path of the differential sigma-delta ADC circuit, and
wherein the differential feedback circuit path extends from an output of the second chopping switch matrix circuit to an input of the third chopping switch matrix circuit.

6. The apparatus of claim 4, including a differential feedback circuit path extending from an output of the second chopping switch matrix circuit to an input of the first chopping switch matrix circuit.

7. The apparatus of claim 4, including:
a phase clock circuit configured to generate a first operational clock phase and a second operational clock phase,
wherein, during the first operational clock phase, the first chopping switch matrix circuit is configured to electrically isolate the MEMS sensor circuit from the differential sigma-delta ADC circuit, and
wherein, during the second operational clock phase, the first and second chopping switch matrix circuits are configured to invert the polarity of the differential chopping circuit path.

8. The apparatus of claim 7, including:
a driver circuit electrically coupled to the MEMS sensor, wherein the driver circuit is configured to apply a square wave excitation signal to a drive input of the MEMS sensor, and
wherein the first and second operational clock phases have the same frequency and duty cycle as the square wave excitation signal.

9. The apparatus of claim 1, including the MEMS sensor circuit, wherein the MEMS sensor circuit is configured to change capacitance in response to linear acceleration in a first direction.

10. An apparatus comprising:
a capacitance-to-voltage converter circuit configured to be electrically coupled to a MEMS sensor circuit, the capacitance-to-voltage converter circuit including:
a differential circuit path configured to receive a differential MEMS sensor output signal;
a differential sigma-delta ADC circuit configured to sample the differential MEMS sensor output signal and provide a digital signal representative of a change in capacitance of the MEMS sensor, wherein the differential sigma-delta ADC circuit includes a comparator circuit; and
a pseudo-random noise generator circuit electrically coupled to the comparator circuit and configured to apply dither noise to an input of the comparator circuit.

11. The apparatus of claim 10, including the MEMS sensor circuit, wherein the MEMS sensor circuit is configured to change capacitance in response to linear acceleration in a first direction.

12. The apparatus of claim 11, including:
a switch circuit electrically coupled to the MEMS sensor;
a driver circuit electrically coupled to the MEMS sensor and configured to apply a square wave excitation signal to a drive input of the MEMS sensor;
a phase clock circuit electrically coupled to the switch circuit and configured to generate a first operational clock phase and a second operational clock phase, wherein the first and second operational clock phases have the same frequency and duty cycle as the square wave excitation signal, and
wherein, during the first operational clock phase, the switch circuit is configured to electrically isolate the MEMS sensor circuit from the differential sigma-delta ADC circuit and the MEMS sensor circuit is configured to sample the linear acceleration.

13. The apparatus of claim 11,
wherein the MEMS sensor circuit is configured to change a first capacitance in response to linear acceleration in a first direction, and change a second capacitance in response to linear acceleration in a second direction, and
wherein the apparatus includes a first capacitance-to-voltage converter circuit to generate a first digital signal representative of a change in the first capacitance and a second capacitance-to-voltage converter circuit to generate a second digital signal representative of a change in the second capacitance.

14. A method comprising:
sensing an output of a micro-electromechanical system (MEMS) sensor to create a differential sensor output signal;
applying the output of the MEMS sensor to a differential chopping circuit path, wherein a polarity of the differential chopping circuit path is inverted at timed intervals; and
sampling the chopped MEMS sensor output signal with a differential sigma-delta analog to digital converter (ADC) circuit to generate a digital signal representative of a change in capacitance of the MEMS sensor.

15. The method of claim 14, including applying dither noise to the differential sigma-delta ADC circuit.

16. The method of claim 14, including clocking the differential chopping circuit path with a pseudo-random clock signal.

17. The method of claim 14, wherein applying the output of the MEMS sensor to a differential chopping circuit path includes:
   inverting the polarity of the differential chopping circuit path at an input of an opamp circuit of the differential sigma-delta ADC circuit; and
   inverting the polarity of the differential chopping circuit path at an output of the opamp circuit.

18. The method of claim 14, wherein applying the output of the MEMS sensor to a differential chopping circuit path includes:
   feeding back a differential output of the opamp circuit to a differential input of the opamp circuit to form a differential feedback circuit path; and
   inverting a polarity of the differential feedback circuit path at timed intervals.

19. The method of claim 14, wherein applying the output of the MEMS sensor to a differential chopping circuit path includes:
   electrically isolating the MEMS sensor circuit from the differential sigma-delta ADC circuit during a first operational clock phase; and
   inverting the polarity of the differential chopping circuit path during a second operational clock phase.

20. The method of claim 19, including:
   applying a square wave excitation signal to a drive input of the MEMS sensor, wherein the first and second operational clock phases have the same frequency and duty cycle as the square wave excitation signal; and
   sampling the linear acceleration using the MEMS sensor during the first operational clock phase 21. The method of claim 14, wherein sensing an output of the MEMS sensor includes sensing a change in capacitance of the MEMS sensor in response to linear acceleration in a first direction.

22. The method of claim 14, wherein sensing an output of the MEMS sensor includes:
   sensing a first output of the MEMS sensor to sense a change in capacitance of the MEMS sensor in response to linear acceleration in a first direction; and
   sensing a second output of the MEMS sensor to sense a change in capacitance of the MEMS sensor in response to linear acceleration in a second direction, wherein the second direction is orthogonal to the first direction.

* * * * *